United States Patent [19]
Grabbe

[11] Patent Number: 6,012,225
[45] Date of Patent: Jan. 11, 2000

[54] METHOD OF MAKING SURFACE MOUNT PADS

[75] Inventor: Dimitry Grabbe, Middletown, Pa.

[73] Assignee: The Whitaker Corporation, Wilmington, Del.

[21] Appl. No.: 09/019,317

[22] Filed: Feb. 5, 1998

Related U.S. Application Data

[62] Division of application No. 08/763,060, Dec. 10, 1996, abandoned.

[51] Int. Cl.[7] .................................................... H01R 9/00
[52] U.S. Cl. ........................ 29/843; 29/842; 228/180.21
[58] Field of Search ........................... 29/842, 843, 830; 228/180.21

[56] References Cited

U.S. PATENT DOCUMENTS

| | | | |
|---|---|---|---|
| 4,517,739 | 5/1985 | Lenaerts et al. | 29/846 |
| 5,073,118 | 12/1991 | Grabbe et al. | 439/71 |
| 5,093,986 | 3/1992 | Mandai et al. | 29/893 |
| 5,442,852 | 8/1995 | Dannes | 29/843 |
| 5,451,174 | 9/1995 | Bogursky et al. | 439/876 |
| 5,550,083 | 8/1996 | Koide et al. | |
| 5,597,434 | 1/1997 | Kukoff | 156/240 |
| 5,607,313 | 3/1997 | Nyman | 439/83 |

FOREIGN PATENT DOCUMENTS

| | | | |
|---|---|---|---|
| 0407103 A2 | 6/1990 | European Pat. Off. | H01L 23/40 |
| 60-202966 | 10/1985 | Japan | 29/843 |
| 3-181192 | 8/1991 | Japan | 29/843 |

OTHER PUBLICATIONS

PCT International Application Number and International Search Report, PCT/US92/08624, dated Apr. 15, 1993.

International Search Report, PCT/US 97/22583, dated Apr. 28, 1998.

*Primary Examiner*—Carl J. Arbes

[57] ABSTRACT

An apparatus and method for establishing a reliable compressive electrical connection between an electronic package and surface mount pads (6) of the printed circuit board (4) are disclosed. Contact pads (2) are solderable to pads (6) of the printed circuit board (4) and have electrically compatible metallurgy on the contact surface (10). These contact pads (2) are solderable to the pads (6) on their mounting surface (12). The contact pads (2) are assembled to the printed circuit board (4) by first adhesively attaching an array of contact pads to a film (20) and then placing the array over the pads (6) of the printed circuit board (4) and finally reflowing solder (7) which was previously attached to the pads (6) to complete the attachment.

3 Claims, 4 Drawing Sheets

6,012,225

METHOD OF MAKING SURFACE MOUNT PADS

This application is a divisional application of application Ser. No. 08/763,060 filed Dec. 10, 1996 now abandoned.

FIELD OF THE INVENTION

This invention is related to the electrical connection of electronic components to a printed circuit board, and more particularly to surface mount pads which are mountable to the printed circuit board in order to facilitate such electrical connections.

BACKGROUND OF THE INVENTION

Pin grid arrays (PGAs), land grid arrays (LGAs) and ball grid arrays (BGAs) are well-known electronic packages in the electronics industry. The current trend is towards the use of BGA and LGA packages. LGA packages require a compressive socketing approach. The packages generally have gold on the surface of their pads which permits a lower compressive contact force to be used in order to establish reliable electrical connection between the package and the printed circuit board. When printed circuit boards are manufactured, they typically contain solder plated through-holes or surface pads for mounting of components thereon. Compressively mounting of an electronic package to such a solder plated pad or through-hole would require a relatively high compressive force in order to establish good electrical connection between the package and the printed circuit board. The contact force necessary to establish reliable electrical connection between a package and solder plated pads of a circuit board would be approximately 150 grams whereas the force required to establish reliable electrical connection between two gold surfaces is approximately 50 grams. Since the pads of an electronic package are typically gold plated, it would be desirable to have a gold surface of mating pads on the circuit board. This presents a problem, however, in that a complex set of procedures would be required in manufacturing such a circuit board in order to plate isolated areas of the circuit board with gold.

U.S. Pat. No. 5,073,118 by Grabbe et al. teaches electrical terminals comprising a head having a flat contact pad engaging face and a shank in the form of a compliant pin which extends through a plated hole of the printed circuit board in order to allow an electronic package such as a land grid array to be compressively mounted over the flat contact pad engaging face. The contact pad engaging face is gold plated therefore reducing the compressive force necessary in order to establish a reliable electrical connection. This approach, however, does not provide a method of connecting an electronic package to a printed circuit board which does not have plated through-holes but instead is designed for surface mount type connections. A problem, therefore, exists in that there is a need to establish a gold-to-gold electrical connection between the pads of an electronic package and a printed circuit board designed for surface mounting connections only.

SUMMARY OF THE INVENTION

It is an object of this invention to provide a structure and a method for establishing a reliable compressive electrical connection between an electronic package and surface mount pads of a printed circuit board.

This object has been achieved by providing a contact pad which is generally planar and surface mountable to a printed circuit board. The contact pad has a mounting surface which is surface mountable to solder plated pads of the printed circuit board. A contact-engaging face is disposed opposite the mounting surface and is plated with a material such as gold or palladium which is electrically compatible with the contact pads of the electronic package to establish a reliable electrical connection therebetween by application of a relatively small compressive force.

BRIEF DESCRIPTION OF THE DRAWINGS

The invention will now be described by way of example with reference to the accompanying figures of which.

DETAILED DESCRIPTION OF THE INVENTION

Figure 1:
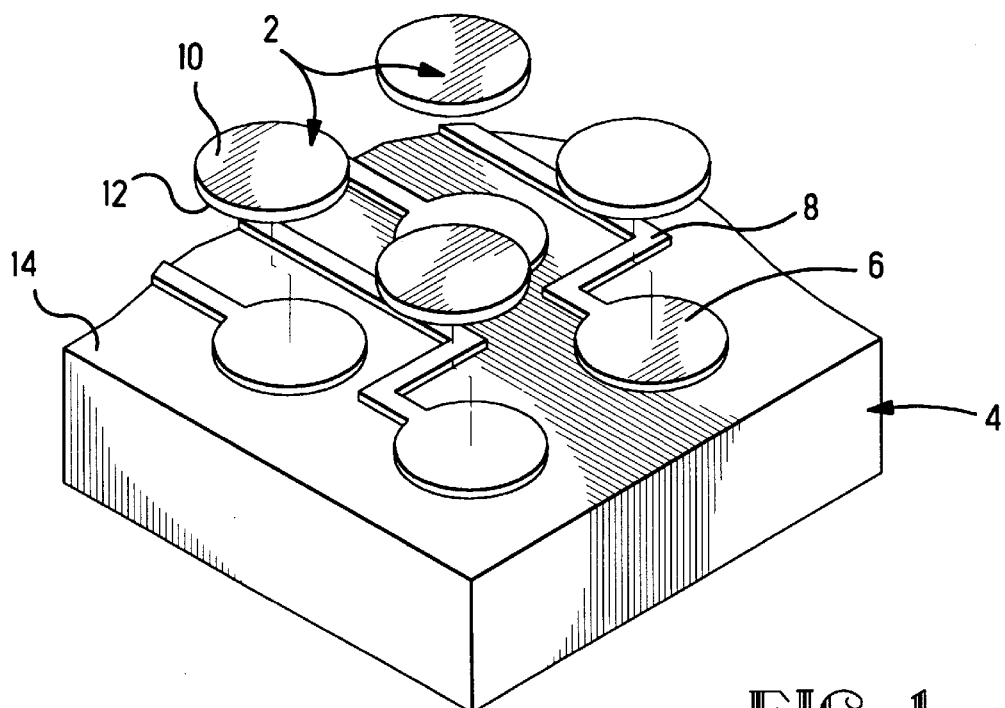
FIG. 1 shows a three-dimensional view of the contact pads according to this invention suspended over a printed circuit board prior to mounting.
Figure 4:
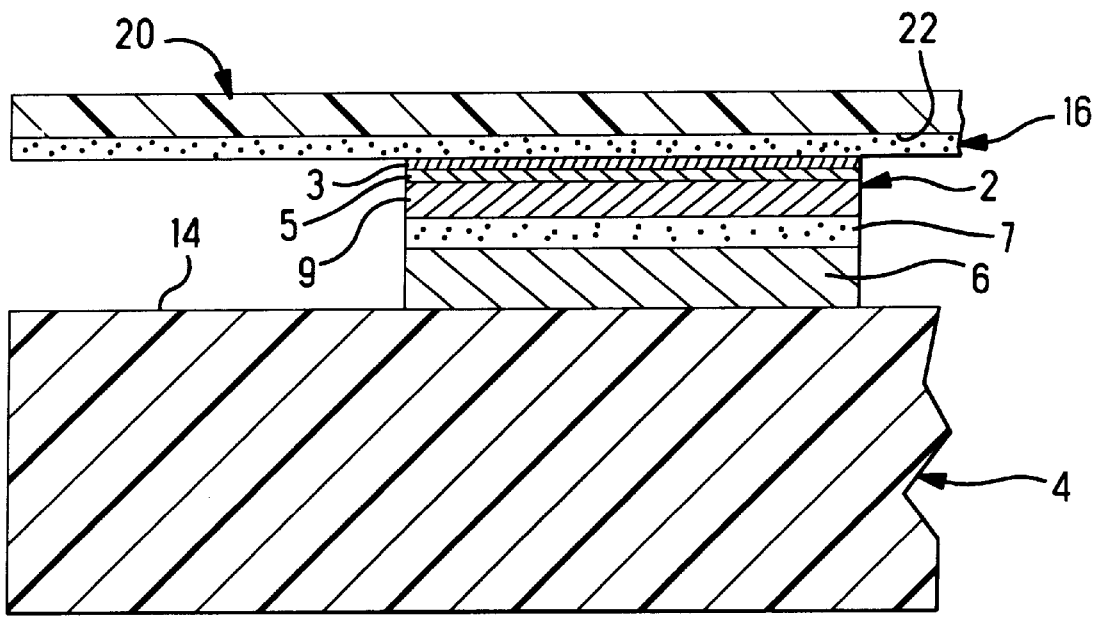
FIG. 4 shows a cross sectional view of a contact pad and film of FIG. 2.

The invention will first be described generally with reference to FIG. 1 which shows contact pads 2 suspended over a printed circuit board 4 prior to assembly. A printed circuit board 4 is typically manufactured with circuit traces 8 connected to components on the printed circuit board and pads 6 extending from the traces for connection to such components. The pads 6 are coated with solder paste 7 as can be seen in FIG. 4. The contact pads 2 are shown here to have a generally planer body formed in a disc shape. The contact pads 2 may be formed in other shapes which are suited for conformance to a particular shape of the pad 6 which is disposed on an upper surface 14 of a printed circuit board 4. The contact pads 2 have a mounting surface 12 which is solderable using surface mount techniques to the pads 6 of the printed circuit board 4. A contact surface 10, disposed opposite the mounting surface 12, utilizes conventional metallurgy in order to establish reliable electrical connection to the pads of an electronic package (not shown). An example of conventionally used metallurgy is a nickel barrier 6 with a gold overcoat 9 which can be electroplated, sputtered, welded or rolled on as is well known in the industry. The preferred metallurgical composition of the contact pad 2 is first a layer of solder 7 at the mounting surface 12, then a layer of copper 3, then a layer of nickel 5, an finally a layer of gold 9 at the contact surface 10.

Figure 2:
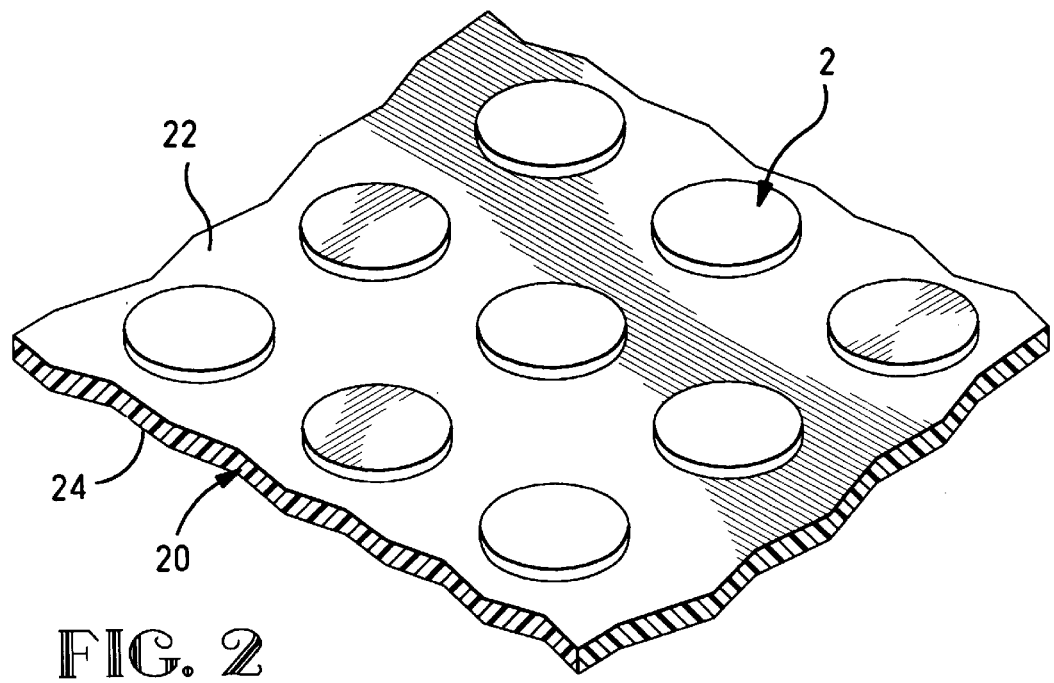
FIG. 2 shows a three-dimensional view of the contact pads according to this invention being adhesively attached to a film prior to assembly to the printed circuit board.
Figure 3:
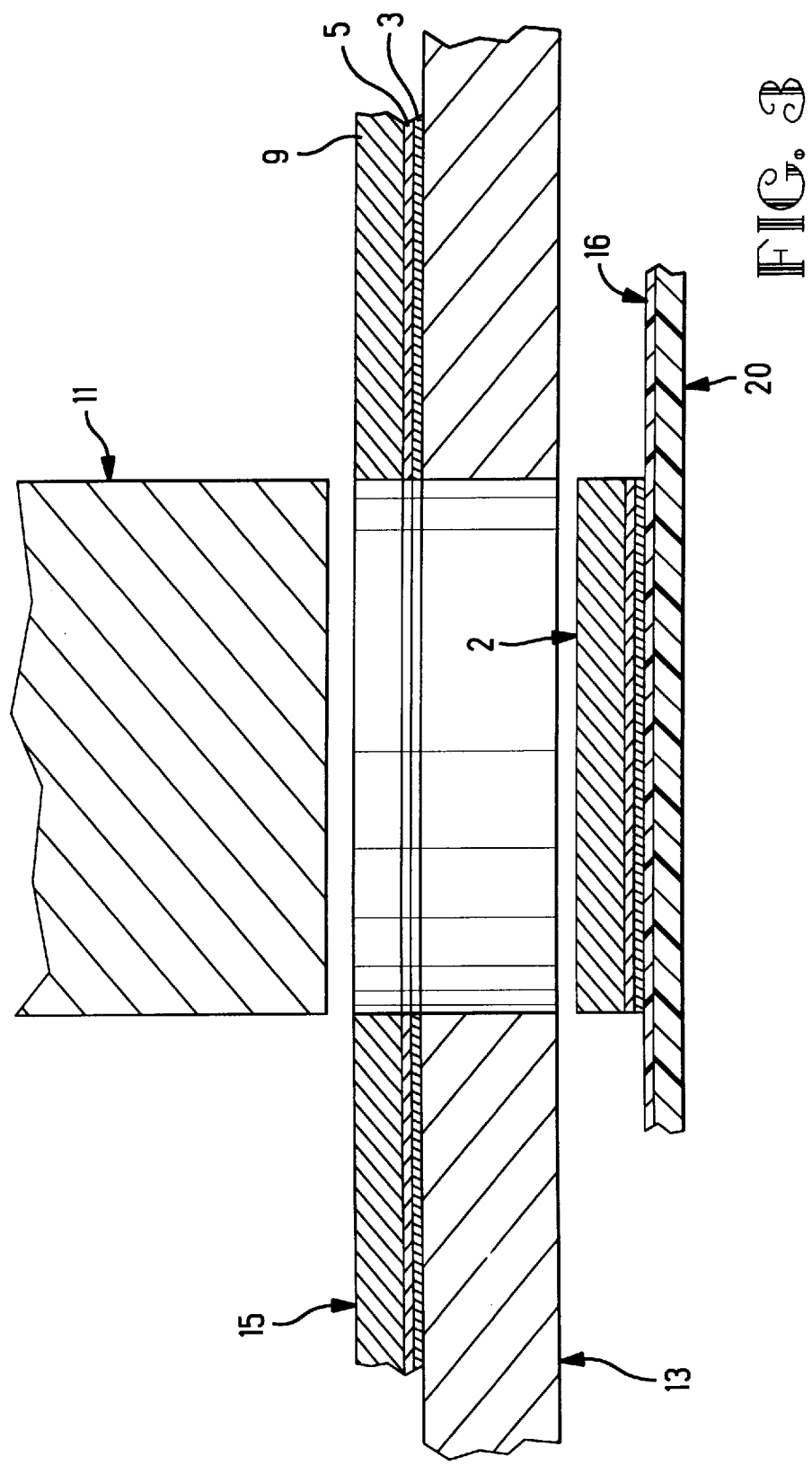
FIG. 3 show a cross sectional view of a method of making the structure according to this invention.

Assembly of the contact pads to a printed circuit board will now be described in greater detail with reference to FIGS. 2 to 5. Referring first to FIG. 2, an array of contact pads 2 are adhesively attached to a film 20 such as polymide, polyester or any other film material which is suitable to withstand the temperatures required to reflow solder. The film 20 has an adhesive 16 (FIG. 3) applied to its contact surface 22 which temporarily captures the contact pads 2 in a desired array corresponding to the location of contact pads 6 on the printed circuit board 4 to which the pads 2 are to be mounted. The array is formed by first plating a sheet 15 of copper material as described above. Each pad 2 is then stamped from the plated sheet 15 as shown in FIG. 3. Stamping is performed by a punch 11 which travels from the position shown in FIG. 3 downward to contact the sheet 15 and extract a contact pad 2 through the die plate 13. The downward punch stroke ends at a point where the contact pad 2 is adhesively attached to the film 20. Contact pads 2 can be formed by this method where the sheet is continuously fed in one direction or formed by a similar method where the sheet is moved in two axes to punch an array of holes in a wider sheet. Alternatively, a process such as one used for making printed circuit boards may be utilized to create the array of pads on the film 20.

Referring to FIG. 4 which shows a portion of the film 20 and a contact pad 2, the film 20 being populated with contact pads 2 is placed over the printed circuit board 4 such that the contact pads 2 are aligned with pads 6 of the printed circuit board 4. Because the contact surface 22 extends beyond the edges of the pad array, it may be used to position and adhesively attach the film to the top surface 14 of the printed circuit board 4 in order to maintain the array in a properly aligned position for the soldering operation.

Figure 5:
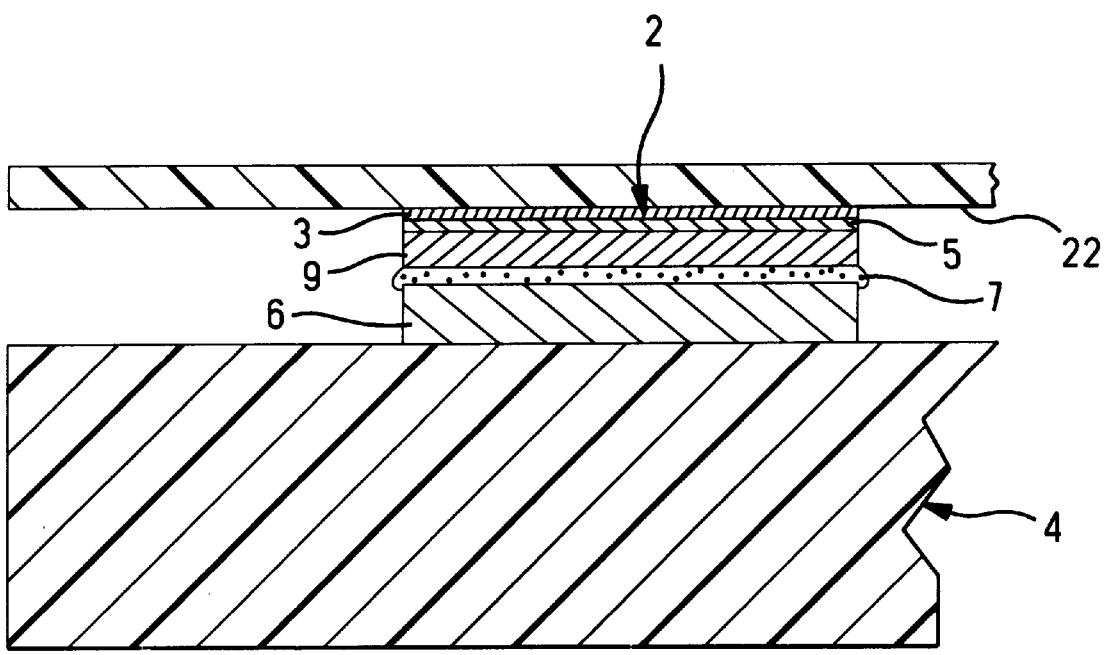
FIG. 5 shows a cross sectional view similar to that of FIG. 3 with the contact pad still mounted on the film and being soldered to a pad of the printed circuit board.
Figure 6:
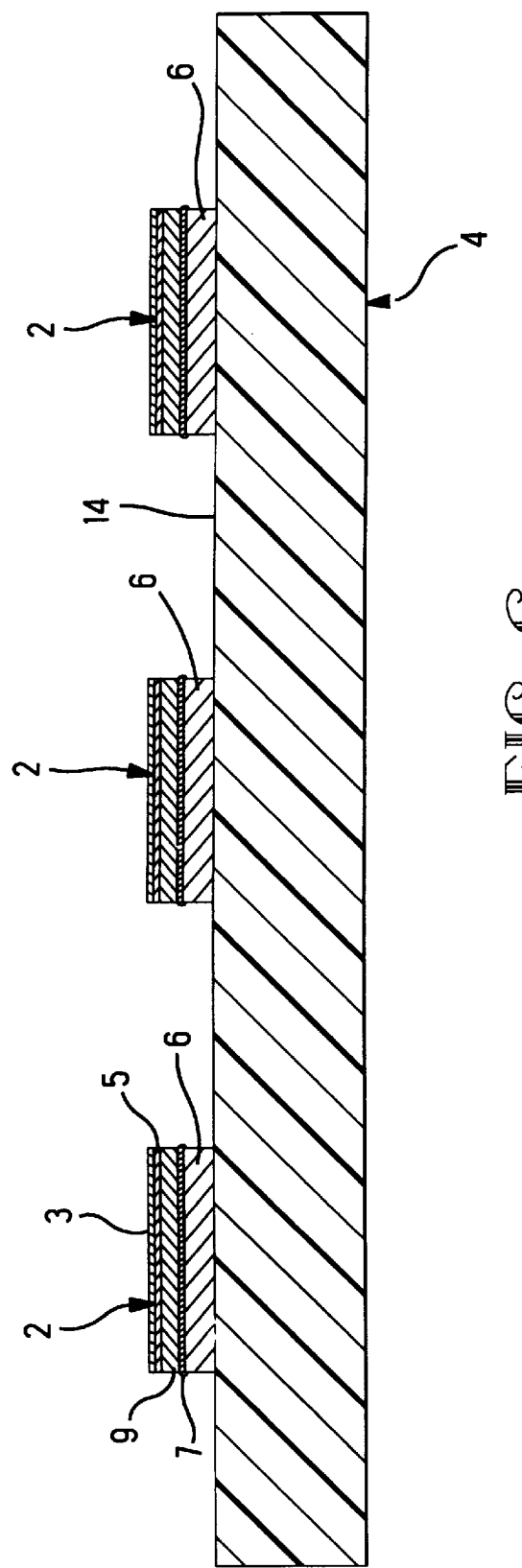
FIG. 6 shows a cross sectional view of the contact pads after removal of the film.

Referring now to FIG. 5, the soldering operation will be described in greater detail. The entire assembly is placed into a reflow oven such that the solder 7 will flow to form solder connections between the contact pads 2 and the pads 6 of the printed circuit board 4. It should also be noted at this step that the adhesive 16 has melted away from the film 20. An alternative high temperature adhesive could be used which would not melt during the reflow step. Finally, the film 20 is removed from the contact pads 2 (FIG. 6) and the assembly is complete. The printed circuit board 4 has contact pads 2 having electrically compatible contact surfaces 10 mounted thereon which can accept a compressive connection to an electronic package.

The advantage of this invention is that it provides an electrically compatible contact pad for establishing a low compressive force reliable electrical connection between an electronic package and the pads of a printed circuit board. An additional advantage of this invention is that it provides a simple method of assembling such contact pads to a printed circuit board without the need for complex localized plating operations.

I claim:

1. A method of mounting an array of generally planar contact pads to a corresponding array of pads on a printed circuit board, the contact pads having a contact surface being plated with a material which is electrically compatible with contact pads of an electronic package, the method comprising the steps of:

adhesively attaching a plurality of contact pads to a film such that they are arranged in an array which matches the corresponding array of pads on the printed circuit board, applying solder paste to an exposed surface of each corresponding pad in the corresponding array of pads on the printed circuit board, placing the film having the array of contact pads over the printed circuit board such that each contact pad in the array engages the exposed surface of a corresponding pad on the printed circuit board, reflowing the solder paste, and;

removing the film from the contact pads.

2. The method as recited in claim 1 further comprising the steps of extending the film beyond the area of the array of contact pads and applying a contact adhesive to a major surface thereof.

3. A method of mounting an array of generally planar contact pads to a corresponding array of pads on a printed circuit board, the contact pads having a contact surface being plated with a material which is electrically compatable with contact pads of an electronic package, the method comprising the step of:

adhesively attaching a plurality of contact pads to a film such that they are arranged in an array which matches the corresponding array of pads on the printed circuit board, applying solder paste to an exposed surface of each corresponding pad in the corresponding array of pads on the printed circuit board, extending the film (cl 7) beyond the erea of the array of contact pads and applying a contact adhesive to a major surface thereof, placing the film having the array of contact pads over the printed circuit board such that each contact pad in the array engages the exposed surface of a corresponding pad on the printed circuit board, reflowing the solder paste; and;

removing the film from the contact pads, wherein each contact pad is punched from a sheet of plated material and adhesively applied to the film in a single punch stroke.

* * * * *